United States Patent [19]

Valdettaro

[11] 4,177,429

[45] Dec. 4, 1979

[54] SWITCHING ARRANGEMENT FOR COMBINATION VHF-UHF TUNERS

[75] Inventor: Alarico A. Valdettaro, Bloomington, Ind.

[73] Assignee: Sarkes Tarzian, Inc., Bloomington, Ind.

[21] Appl. No.: 860,485

[22] Filed: Dec. 14, 1977

[51] Int. Cl.$^2$ .............................................. H04B 1/06
[52] U.S. Cl. ..................................... 325/459; 358/191; 334/50
[58] Field of Search ............... 325/458, 457, 459, 461, 325/462, 464, 465; 358/191; 334/47, 50, 52

[56] References Cited

U.S. PATENT DOCUMENTS

| 3,333,202 | 7/1967 | Valdettaro | 325/459 |
| 3,757,227 | 9/1973 | Weigel | 325/462 |

Primary Examiner—Robert L. Richardson
Assistant Examiner—Alexander Gerasimow
Attorney, Agent, or Firm—Mason, Kolehmainen, Rathburn & Wyss

[57] ABSTRACT

A switching arrangement for VHF-UHF tuners is provided wherein changeover from VHF operation to UHF operation is accomplished by employing wiping action stator contacts and with a minimum of connections between the VHF and UHF tuners.

9 Claims, 2 Drawing Figures

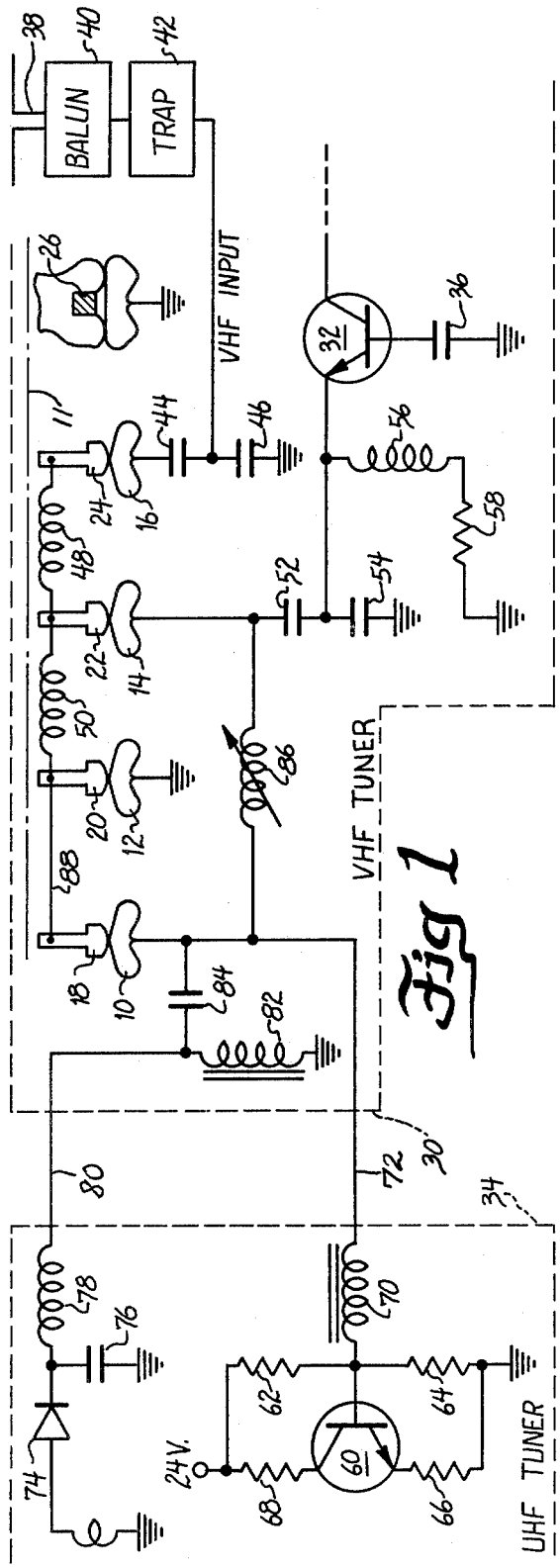
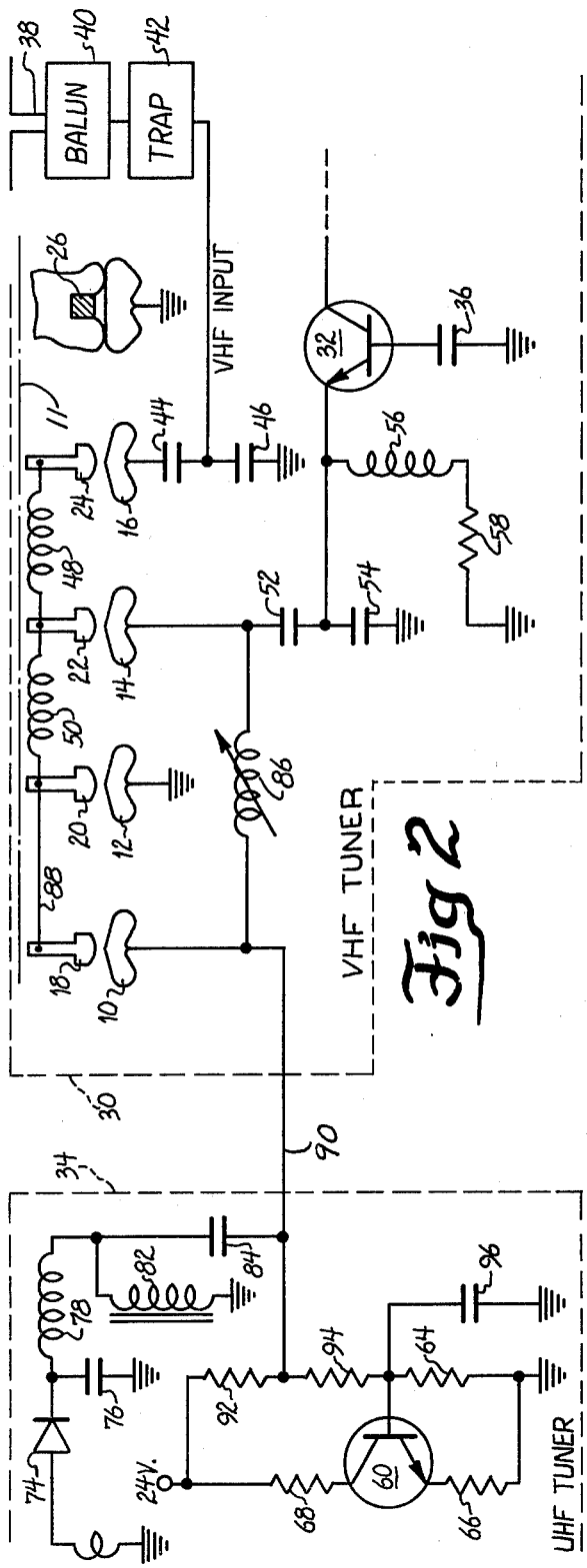

SWITCHING ARRANGEMENT FOR COMBINATION VHF-UHF TUNERS

The present invention relates to VHF-UHF tuners and more particularly to an improved switching arrangement for such tuners whereby changeover between the VHF and UHF bands may be effected in a simple and reliable manner.

Various types of switching arrangements have been proposed in the past for changing between the VHF and UHF television bands. For example, in Valdettaro U.S. Pat. No. 3,333,202 a separate UHF tuning stick is employed in a turret type VHF tuner, this tuning stick being operative in a separate UHF position of the VHF turret tuner to cause the VHF turner to operate as an IF amplifier during UHF reception.

In Weigel U.S. Pat. No. 3,757,227 a 24-position combination VHF-UHF television tuner is provided wherein different groups of UHF television stations are selected in alternate ones of twenty-four detent positions during one revolution of the common selector shaft. In the Weigel patent changeover between VHF and UHF television bands is achieved by means of a separate stator bar for UHF B plus switching and utilizing one of the tuning coils on an unused tuning stick. A separate switching finger arrangement is employed for introducing the UHF IF signal into the input of the VHF tuner in alternate detent positions.

In Valdettaro application Ser. No. 776,890 now abandoned filed Mar. 11, 1977, which is assigned to the same assignee as the present invention, a combination VHF-UHF tuner arrangement is provided wherein the common selector shaft is provided with twenty-four detent positions and is rotated a number of revolutions to cover the entire UHF band, the VHF stations being repeatedly received in alternate ones of the twenty-four detent positions as the common selector shaft is rotated a plurality of revolutions. In the above-identified Valdettaro application a number of switching arrangements are described for changing between the VHF and UHF television bands in alternate detent positions of the common selector shaft. While these switching arrangements are suitable for their intended purpose they each require one or more movable blade type switch elements which are mounted on the VHF stator bar and must be actuated in order to accomplish the changeover switching function. These movable blade-type switching elements do not accomplish the make and break action by means of a wiping action but instead simply open and close contacts associated with the movable blade element. Accordingly, the advantages provided by the conventional stator contact wherein large wiping action stator contacts are employed to establish connection to the rounded head contacts of the respective tuning sticks is not achieved. It would be desirable to provide such conventional stator contact construction while requiring a minimum of additional stator contacts on the stator bar to accomplish the changeover function. However, the changeover function must be accomplished without permitting VHF signals to reach the crystal mixer portion of the UHF tuner, otherwise undesired harmonics and cross modulation products may be produced which will interfere with proper VHF reception.

It is an object, therefore, of the present invention to provide a new and improved switching arrangement for a combination VHF-UHF tuner wherein one or more of the above-discussed disadvantages of prior art arrangements is avoided.

It is another object of the present invention to provide a new and improved switching arrangement for a combination VHF-UHF television tuner wherein conventional wiping action stator contacts are employed in the VHF tuner to accomplish all changeover functions necessary to receive signals in both VHF and UHF television bands.

It is a further object of the present invention to provide a new and improved switching arrangement for a combination VHF-UHF television tuner wherein the UHF IF output circuit is continuously connected to the input of the VHF RF amplifier and facilities are provided for preventing VHF signals received during VHF reception from affecting the crystal mixer portion of the UHF tuner thereby eliminating undesired harmonics and cross modulation products from being produced during VHF reception.

It is another object of the present invention to provide a new and improved switching arrangement for a combination VHF-UHF television tuner wherein only a single wire need be connected between the VHF and UHF portions of the tuner to accomplish all changeover functions for receiving signals in both the VHF and UHF television bands.

The invention, both as to its organization and method of operation, together with further objects and advantages thereof, will best be understood by reference to the following specification taken in connection with the accompanying drawings in which:

FIG. 1 is a schematic diagram of a switching arrangement according to the present invention wherein the VHF turret is shown in one of the alternate VHF detent positions; and FIG. 2 is a schematic diagram of an alternative embodiment of the present invention wherein the VHF turret is shown in a UHF position.

Referring now to the drawings and more particularly to FIG. 1 thereof, the switching arrangement of the present invention is intended to be used in a combination VHF-UHF television tuner arrangement such as described in detail in Valdettaro application Ser. No. 776,890 filed Mar. 11, 1977, and reference may be had to said copending application for a detailed description of such combination VHF-UHF television tuner. For the purposes of the present invention, it may be briefly stated that the common selector shaft 11 of the television tuner is provided with twenty-four equally spaced detent positions in alternate ones of which the VHF tuner is adapted to receive any one of the twelve VHF television stations. In the detent positions between these twelve alternate detent positions, the UHF Television tuner is adapted to receive individual ones of the seventy UHF television stations as the selector shaft is rotated through a plurality of revolutions, the VHF tuner receiving the same VHF stations during successive revolutions of the common selector shaft. With such an arrangement, it is necessary to switch back and forth between the VHF and UHF television bands at each detent position of the common selector shaft. Therefore, the switching arrangement to accomplish this changeover function must be extremely rugged since it is continually being used as the selector shaft is moved to select different desired VHF and UHF television stations. This is true even though the arrangement shown in Valdettaro application Ser. No. 776,890 provides reception for both VHF and UHF stations in many areas within one revolution of the selector shaft because each revolution of the selector shaft requires twelve changes back and forth between the VHF and UHF television bands during a single revolution of the selector shaft.

In accordance with the present invention, all of the changeover functions for switching between VHF and UHF stations are accomplished while employing the bowed stator contacts 10, 12, 14 and 16 which are secured in the stationary stator bar of the VHF tuner and make wiping contact with the arcuately shaped stick contacts 18, 20, 22 and 24, respectively, which are carried by each of the twelve VHF tuning sticks or tuning panels 26. The stator contacts 10-16 are relatively wide and make wiping contact in both directions with the arcuate stick contacts 18-24, so that uniform reliable connections are established in each of the twelve alternate VHF detent positions of the common selector shaft, as described in more detail in said copending Valdettaro application Ser. No. 776,890. In this connection it will be understood that the individual tuning sticks, such as the tuning sticks 26 shown in FIG. 1 are successively connected to the stator contacts 10-16 in each of the twelve alternate VHF detent positions of the twenty-four position detented common station selector shaft 11.

In the arrangement of the present invention the RF amplifier of the VHF tuner portion 30 of the combination VHF-UHF tuner includes a transistor 32 which is operated in the common base mode and acts as either the RF amplifier for VHF reception or as an IF amplifier for the UHF IF signal which is supplied from the UHF tuner 34 in the detent positions between the VHF alternate positions. The base of the transistor 32 is connected to RF ground through a capacitor 36 and an input signal is supplied to the emitter of this transistor the collector thereof being connected to the RF output circuit which is tuned either to the particular VHF station by means of a tuning coil on the stick 26, or to the UHF IF signal when no stick is connected to the contacts 10-16, as described in detail in Valdettaro application Ser. No. 776,890.

The VHF signal which is received on the antenna 38, is supplied through a balun network 40 and a trap circuit 42 to the junction of a pair of capacitors 44 and 46 which are connected between the stator contact 16 and ground. The coils 48 and 50 which are wound on the stick 26, are connected in series between the stick contacts 24 and 20, the junction of the coils 48, 50 being connected to the stick contact 22. The stator contact 12 is connected to ground so that in a VHF position of the selector shaft, as shown in FIG. 1, the VHF input signal is supplied through the capacitor 44 to the tuning coils 48, 50 and a portion of this signal is supplied by way of the stick contact 22, the stator contact 14 and a capacitor 52 to the emitter of the transistor 32. A capacitor 54 is connected from the emitter of the transistor 32 to ground. A peaking coil 56 is also connected in series with a resistor 58 between this emitter and ground.

During UHF reception, all of the VHF tuning sticks, such as the stick 26, are disconnected from the stator contacts 10-16. Accordingly, in any of the detent positions between the alternate VHF detent positions, the UHF tuner 34 is enabled and provides a UHF IF output signal which is supplied to the input of the transistor 32 in place of the VHF signal. More particularly, the UHF oscillator in the UHF tuner 34 comprises a transistor 60 the base of which is connected to the junction of a pair of resistors 62, 64 which are connected in series between a 24-volt supply and ground. The emitter of the transistor 60 is connected through a resistor 66 to ground and the collector of the transistor 60 is connected through a resistor 68 to the B plus supply. The base of the transistor 60 is also connected through an RF choke 70 and over a conductor 72 to the stator contact 10 in the VHF tuner 30. However, in UHF positions of the selector shaft, the stator contact 10 is not connected to the stick contact 18 on any of the tuning sticks and hence the oscillator 60 is permitted to oscillate and develop the required UHF oscillator signal. This oscillator signal is mixed with the incoming RF signal from a desired UHF station and is supplied to a crystal mixer 74 so that a desired IF output signal, customarily of a frequency of forty megacycles, is developed across the tank circuit capacitor 76. This IF signal is supplied by way of a tuning coil 78, a conductor 80 between the VHF and UHF tuners, and a crystal return choke coil 82 in the VHF tuner 30, the coil 82 acting as a d.c. return for the crystal mixer circuit in the UHF tuner 34. A capacitor 84 is connected between the choke 82 and the stator contact 10 and an IF matching coil 86 is connected between the stator contacts 10 and 14. Accordingly, the UHF IF output signal is supplied through the capacitor 84, the matching coil 86 and the capacitor 52 to the input of the transistor 32, this input being tuned to forty megacycles by means of the above-described IF circuit including the matching coil 86.

Returning now to the situation which exists when a VHF station is being received, during VHF reception it is necessary first to disable the UHF oscillator 60. It is also necessary to prevent the VHF signal which is being received from being fed back to the crystal mixer circuit 74 in the UHF tuner 34 so as to avoid undesired cross modulation products in this mixer circuit. In order to accomplish these functions in a simple and reliable manner, the stick contacts 18, 20 are connected together by means of the wire 88 on each of the tuning sticks so that when any one of the VHF tuning sticks is connected to the stator contacts 10-16 the base of the UHF transistor oscillator 60 is connected to ground through a circuit which includes the choke coil 70, the conductor 72, the stator contact 10, the stick contact 18, the wire 88, the stick contact 20 and the stator contact 12.

In accordance with an important aspect of the present invention, the junction between the capacitor 84 and the matching coil 86 is connected to ground in each of the VHF positions of the selector shaft so that no VHF signals can be fed back through the UHF IF output circuit to the crystal mixer 74. This is accomplished by connecting the junction of the capacitor 84 and the coil 86 to the stator contact 10 which is then connected to ground through the wire 88 and the stator contact 12 in each of the VHF positions of the selector shaft. Since the matching coil 86 for the UHF IF output circuit is of relatively high impedance as compared to the tuning coils 48, 50 on the tuning stick 26, the matching coil 86 may remain permanently connected between the stator contacts 10 and 14 and yet will not interfere with proper operation of the VHF tuner 30 during VHF reception. On the other hand, during UHF reception the RF choke 70 has a sufficiently high impedance that it does not interfere with the UHF IF output circuit, even though it is permanently connected between the junction of the capacitor 84 and matching coil 86, so that the UHF IF output signal may be transmitted to the input of the transistor 32 even though the RF choke 70 remains permanently connected to the stator contact 10 in the VHF tuner 30. In this connection it is pointed out that the RF amplifier 32 in the VHF tuner 30 is of the common base type which has a relatively low input impedance. Accordingly, it is necessary to tap down the VHF input signal so as to match the antenna input circuit impedance of the VHF tuner to the input impedance of the transistor 32. This is accomplished by connecting the VHF antenna signal to the two tuning coils 48, 50 in series and tapping off the input for the transistor 32 from only the signal developed on the coil 50. However, if desired, other types of RF amplifiers may be employed in which case a suitable re-arrangement of the matching between the VHF antenna circuit and the input to the IF amplifier would be made, as will be readily understood by those skilled in the art.

Referring now to FIG. 2, an alternative embodiment of the present invention is therein shown wherein a single conductor 90 is connected between the UHF tuner 34 and VHF tuner 30. In most respects the embodiment of FIG. 2 is similar to that of FIG. 1 and similar reference numerals have been applied to common circuit elements. However, in the embodiment of FIG. 2 a different arrangement is employed for disabling the UHF oscillator 60 so that only the single conductor 90 is required to accomplish the necessary grounding functions in the VHF positions of the selector shaft. More particularly, in the embodiment of FIG. 2 the RF choke 70 is eliminated and a pair of resistors 92 and 94 are connected in series between the 24-volt supply and the base of the transistor 60. A capacitor 96 is connected from the base of the transistor 60 to ground. The stator contact 10 in the VHF tuner 30 is permanently connected by way of the conductor 90 to the junction of the resistors 92 and 94. Also, in the embodiment of FIG. 2 the crystal return choke coil 82 is contained within the chassis of the UHF tuner 34 and the capacitor 84 is connected from the high side of the choke coil 82 to the conductor 90 within the chassis of the UHF tuner 34 so that only the single conductor 90 is required to be connected between the tuners 34 and 30.

In the embodiment of FIG. 2, during UHF reception the UHF IF signal is supplied through the capacitor 84, the conductor 90 and the matching coil 86 to the input of the transistor 32. Preferably, each of the resistors 92 and 94 has a value of approximately 7,500 ohms and hence these resistors have a sufficiently high resistive value that the UHF IF output signal does not affect the operation of the UHF oscillator 60 even though the junction of the resistors 92 and 94 is connected permanently to the junction of the capacitor 84 and the matching coil 86. During UHF reception the resistors 92 and 94 are connected in parallel insofar as the UHF RF circuit is concerned so that an effective impedance of approximately 3,750 ohms is connected to the conductor 90. This impedance is sufficiently large that it does not interfere with the low impedance UHF IF output circuit which supplies the IF signal from the crystal mixer 74 to the input of the transistor 32. Accordingly, the resistors 92 and 94 can remain permanently connected in the circuit without interfering with the operation during UHF reception.

During VHF reception, the conductor 90 is connected to ground through each of the tuning sticks, such as the tuning stick 26, by means of the circuit which includes the stator conductor 10, the stick contact 18, the wire 88, the stick contact 20, and the stator contact 12. When the conductor 90 is thus grounded in each of the VHF alternate detent positions of the selector shaft, the UHF oscillator 60 is disabled because of the junction of the resistors 92 and 94 is connected to ground. Connection of this juncture to ground effectively removes the biasing voltage from the base of the transistor 60 so that this transistor can no longer function as a UHF oscillator. In addition, since the conductor 90 is connected to ground it effectively prevents feedback of VHF signals through the capacitor 84 back to the UHF IF output circuit so that no VHF signal is supplied to the crystal mixer 74 and cross modulation products are avoided.

While there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in the VHF band in alternate detent positions of said selector shaft, UHF tuner means connected to said selector shaft and effective to receive any one of the seventy UHF stations in the detent positions between said alternate detent positions upon rotation of said selector shaft through a plurality of revolutions, said UHF tuner means including an IF output circuit and a transistor oscillator having a base and a collector, means for continuously supplying a unidirectional supply potential to said collector, said VHF tuner means including a fixed stator member carrying a plurality of stator contacts, means carried by said selector shaft for supporting a plurality of tuning panels, means permanently connecting a first one of said stator contacts to said base and to said IF output circuit, means permanently connecting a second one of said stator contacts to ground, and means carried by each of said tuning panels for electrically connecting said first and second stator contacts together in said alternate detent positions of said selector shaft.

2. The tuner arrangement of claim 1, which includes a capacitor connected between said first stator contact and said IF output circuit, thereby to connect said IF output circuit to ground through said capacitor in said alternate detent positions of said selector shaft.

3. The tuner arrangement of claim 1, which includes an RF amplifier circuit in said VHF tuner means, means permanently connecting said first stator contact to the input of said RF amplifier circuit, thereby to connect an IF signal from said UHF tuner IF output circuit to the input of said RF amplifier circuit in the detent positions between said alternate detent positions.

4. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in the VHF band in alternate detent positions of said selector shaft, UHF tuner means connected to said selector shaft and effective to receive any one of the seventy UHF stations in the detent positions between said alternate detent positions upon rotation of said selector shaft through a plurality of revolutions, said UHF tuner means including a transistor oscillator having a base and a collector, means for continuously supplying a unidirectional supply potential to said collector, means including a resistor connected to said base for supplying a bias potential to said base, thereby to enable said transistor oscillator in the detent positions between said alternate detent positions, said VHF tuner means including a fixed stator member carrying a plurality of stator contacts, means carried by said selector shaft for supporting a plurality of tuning panels which are individually connected to said stator contacts in different ones of said alternate detent positions, means permanently connecting a first one of said stator contacts to said resistor, means permanently connecting a second one of said stator contacts to ground, and means carried by each of said tuning panels for electrically connecting said first and second stator contacts together, whereby said resistor is connected to ground and said UHF oscillator disabled in said alternate detent positions of said selector shaft.

5. The tuner arrangement of claim 4, which includes a bias potential source, a pair of resistors connected in series between said bias potential source and said base, and means permanently connecting said first stator contact to the junction of said pair of resistors, thereby to remove the bias potential from said base and disable said UHF oscillator in said alternate detent positions of said selector shaft.

6. The tuner arrangement of claim 5, wherein said UHF tuner means includes an IF output circuit, and means connecting said IF output circuit to said junction of said pair of resistors.

7. The tuner arrangement of claim 6, wherein said connecting means comprises a capacitor having a relatively low impedance at VHF frequencies thereby effectively to isolate said IF output circuit from said VHF tuner means in said alternate detent positions of said selector shaft.

8. The tuner arrangement of claim 6, which includes an RF amplifier circuit in said VHF tuner means, and means including a UHF IF matching coil for permanently connecting said first stator contact to the input of said RF amplifier circuit, thereby to connect an IF signal from said UHF tuner IF circuit to the input of said RF amplifier circuit in the detent positions between said alternate detent positions.

9. The tuner arrangement of claim 8, wherein said matching coil is connected in parallel with a VHF tuning coil on one of said tuning panels in said alternate detent positions, said matching coil having a high impedance relative to the impedance of any one of said tuning coils.

* * * * *